(12) United States Patent
Dang et al.

(10) Patent No.: US 10,608,194 B2
(45) Date of Patent: Mar. 31, 2020

(54) FLEXIBLE DISPLAY

(71) Applicants: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(72) Inventors: Pengle Dang, Jiangsu (CN); Ji Cheng, Jiangsu (CN); Xiuyu Zhang, Jiangsu (CN); Meiling Gao, Jiangsu (CN)

(73) Assignees: KUNSHAN NEW FLAT PANEL DISPLAY TECHNOLOGY CENTER CO., LTD., Kunshan, Jiangsu (CN); KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 16/315,426

(22) PCT Filed: Jan. 8, 2018

(86) PCT No.: PCT/CN2018/071754
§ 371 (c)(1),
(2) Date: Jan. 4, 2019

(87) PCT Pub. No.: WO2018/127173
PCT Pub. Date: Jul. 12, 2018

(65) Prior Publication Data
US 2019/0319202 A1    Oct. 17, 2019

(30) Foreign Application Priority Data
Jan. 9, 2017 (CN) .................... 2017 2 0023188 U

(51) Int. Cl.
*H01L 51/00* (2006.01)
*H01L 25/18* (2006.01)
*H01L 51/52* (2006.01)

(52) U.S. Cl.
CPC .......... *H01L 51/0097* (2013.01); *H01L 25/18* (2013.01); *H01L 51/5253* (2013.01); *H01L 2251/5338* (2013.01); *H01L 2251/558* (2013.01)

(58) Field of Classification Search
CPC ............. H01L 51/0097; H01L 51/5253; H01L 2251/558; H01L 2251/5338; H01L 27/32
See application file for complete search history.

(56) References Cited

U.S. PATENT DOCUMENTS

2016/0093685 A1   3/2016  Kwon et al.
2016/0190389 A1   6/2016  Lee et al.
(Continued)

FOREIGN PATENT DOCUMENTS

CN      103247233 A      8/2013
CN      103838037 A      6/2014
(Continued)

*Primary Examiner* — Anthony Ho
(74) *Attorney, Agent, or Firm* — Muncy, Geissler, Olds & Lowe, PC

(57) ABSTRACT

A flexible display includes a flexible display screen and a drive chip. The flexible display screen includes a flexible substrate. The flexible substrate includes a display region and a bonding region. The back of the flexible substrate is adhered with a supporting film and the drive chip is bonded to the bonding region.

14 Claims, 4 Drawing Sheets

(56) References Cited

U.S. PATENT DOCUMENTS

2016/0268542 A1    9/2016  Suzuki
2016/0285046 A1    9/2016  Son et al.
2017/0367173 A1*  12/2017  Park ..................... H05K 1/147

FOREIGN PATENT DOCUMENTS

| CN | 104167429 A    | 11/2014 |
|----|----------------|---------|
| CN | 104752443 A    | 7/2015  |
| CN | 204884440 U    | 12/2015 |
| CN | 105633281 A    | 6/2016  |
| CN | 106298620 A    | 1/2017  |
| CN | 206322700 U    | 7/2017  |
| WO | WO 2016111895 A1 | 7/2016 |

* cited by examiner

FLEXIBLE DISPLAY

TECHNICAL FIELD

The present application relates to the field of display technologies, particularly to a flexible display.

TECHNICAL BACKGROUND

Organic Light Emitting Diode (OLED) displays draw much attention as next-generation display devices applied to mobile electronic devices. However, if a glass substrate is used in an OLED display, it is inconvenient to carry the OLED display due to the fragility and poor flexibility of the glass substrate which consequently limits the development of the OLED display to some extent. Therefore, a flexible OLED display is developed by using a flexible substrate (for example, plastic). The flexible OLED display has good flexibility and can be folded or wound to be conveniently carried, overcoming the disadvantages of an ordinary OLED display.

A flexible display mainly includes a flexible display screen and a drive chip, where the flexible display screen includes a flexible substrate comprising a display region and a bonding region, and the drive chip is bonded to the bonding region. At present, thickness of a flexible display screen is very small, usually about 0.02 mm. Therefore, when the drive chip is bonded to the bonding region, the flexible display screen is likely to be warped, resulting in quality degradation of the flexible display screen, or it is difficult for a vacuum cup to suck the flexible display screen, resulting in difficulty in a bonding operation.

SUMMARY

An object of the present application is to provide a flexible display, to resolve problems, such as a flexible display screen being likely to be warped during drive chip bonding or being difficult to be bonded in an existing flexible display manufacturing process.

To resolve the above technical problems, the present application provides a flexible display, including: a flexible display screen and a drive chip, wherein the flexible display screen includes a flexible substrate comprising a display region and a bonding region, a supporting film is adhered to a back of the flexible substrate, and a drive chip is bonded to the bonding region.

Optionally, in the flexible display, each of the display region and the bonding region is provided with supporting film, wherein the supporting film in the display region is viscous and the supporting film in the bonding region is removable.

Optionally, in the flexible display, a supporting film is adhered to the display region and the bonding region has no supporting film.

Optionally, in the flexible display, a supporting film is adhered to each of the display region and the bonding region, where the supporting film in the bonding region has holes formed therein, and the supporting film in the display region has no hole.

Optionally, in the flexible display, a supporting film is adhered to each of the display region and the bonding region, where the supporting film in each of the bonding region and the display region has holes formed therein, and a hole ratio of the supporting film in the bonding region is higher than that of the supporting film in the display region.

Optionally, in the flexible display, the supporting film in the bonding region is more flexible than in the display region.

Optionally, in the flexible display, the thickness of the supporting film ranges from 0.1 μm to 0.3 μm.

Optionally, in the flexible display, the supporting film is made of a material same as a material of the flexible substrate.

Optionally, in the flexible display, the supporting film is made of resins.

Optionally, in the flexible display, the flexible display screen further includes a driver circuit unit located on the front of the flexible substrate; an organic light emitting element located on the front of the flexible substrate and connected to the drive circuit unit; a film sealant covering the organic light emitting element; and a water and oxygen barrier layer covering the film sealant.

In the flexible display provided in the present application, the supporting film is adhered to the back of the flexible substrate, improving rigidity of the flexible display screen to some extent, so that the flexible display screen is unlikely to be warped when a drive chip is bonded thereto and can be easily sucked by a vacuum cup to facilitate bonding, during the flexible display manufacturing process. Particularly, the bonding region has no supporting film, or the supporting film in the bonding region is more flexible than in the display region. That is, on one hand, the flexible display screen is unlikely to be warped when a drive chip is bonded thereto and can be easily sucked by a vacuum cup to facilitate bonding during the flexible display manufacturing process, and on the other hand, the bonding region is enabled to be easily bent to satisfy the bending requirement for the entire flexible display.

DETAILED DESCRIPTION OF EMBODIMENTS

The flexible display provided in the present application is described below in more detail with reference to the accompanying drawings and specific embodiments. The advantages and features of the present application are more apparent according to the following descriptions and claims. It should be noted that the accompanying drawings are provided in a very simplified form not necessarily presented to scale, with the only intention of facilitating convenience and clarity in explaining a few illustrative examples of the present application.

The core idea of the present application is to provide a flexible display, where a supporting film is adhered to the back of the flexible substrate of the flexible display, which can improve rigidity of the flexible display screen to some extent, so that the flexible display screen is unlikely to be warped when a drive chip is bonded thereto and can be easily sucked by a vacuum cup to facilitate bonding, during a flexible display manufacturing process. Particularly, the bonding region has no supporting film, or the supporting film in the bonding region is more flexible than in the display region. That is, on one hand, the flexible display screen is unlikely to be warped when a drive chip is bonded thereto and can be easily sucked by a vacuum cup to facilitate bonding, during the flexible display manufacturing process, and on the other hand, the bonding region is enabled to be easily bent to satisfy the bending requirement for the entire flexible display.

Embodiment 1

Figure 1:
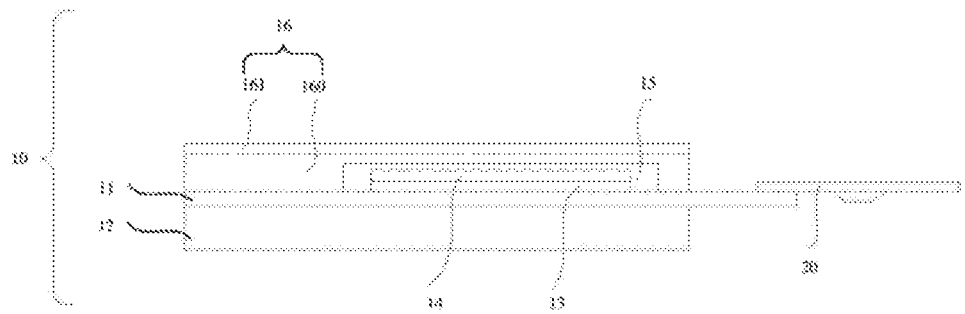
FIG. 1 is a schematic structural diagram of a flexible display according to Embodiment 1 of the present application.

Refer to FIG. 1, a schematic structural diagram of a flexible display according to Embodiment 1 of the present application. As shown in FIG. 1, the flexible display 1 includes a flexible display screen 10 and a drive chip 20, where the flexible display screen 10 includes a flexible substrate 11 comprising a display region and a bonding region, a supporting film 12 is adhered to the back of the flexible substrate 11, and the drive chip 20 is bonded to the bonding region. The support film 12 is adhered to the back of the flexible substrate 11 to improve rigidity of the flexible display screen 10 to some extent, so that the flexible display screen 10 is unlikely to be warped when a drive chip is bonded thereto, and can be easily sucked by a vacuum cup to facilitate bonding during a flexible display manufacturing process.

Continue to refer to FIG. 1, in this embodiment of the present application, a supporting film is adhered to the display region, and the bonding region has no supporting film. Usually, the flexible display has a higher bending requirement for the bonding region than for the display region. That is, the bonding region needs to have a higher degree of curvature. Therefore, in this embodiment of the present application, a supporting film is adhered to the display region, and the bonding region has no support film, so that on one hand the flexible display screen 10 is unlikely to be warped when a drive chip is bonded thereto and can be easily sucked by a vacuum cup to facilitate bonding during the flexible display manufacturing process, and on the other hand, the bonding region can be enabled to have excellent bending performance to satisfy the high bending requirement for the bonding region. The bonding region in a bending condition can be referred to in FIG. 2.

Preferably, the supporting film 12 is made of resins. The resins have excellent flexibility, so that the flexible substrate 11 to which the supporting film 12 is adhered keeps a good flexibility. More preferably, the supporting film 12 is made of a material same as the material of the flexible substrate 11, so that the connection between the supporting film 12 and the flexible substrate 11 is firmer and more stable.

Further, thickness of the supporting film 12 ranges from 0.1 rpm to 0.3 µm. For example, thickness of the supporting film 12 may be 0.1 µm, 0.125 µm, 0.15 µm, 0.175 µm, 0.2 µm, 0.215 µm, 0.25 µm, 0.275 µm, or 0.3 µm, etc. In this embodiment of the present application, thickness of the supporting film 12 selectively ranges from 0.1 µm to 0.3 µm, so that on one hand the flexible display screen 10 is unlikely to be warped when a drive chip is bonded thereto and can be easily sucked by a vacuum cup to facilitate bonding during the flexible display manufacturing process, and on the other hand, the bending requirement for the bonding region can be satisfied.

Continue to refer to FIG. 1, the flexible display 1 further includes a driver circuit unit 13 located on the front of the flexible substrate 11; an organic light emitting element 14 located on the front of the flexible substrate 11 and connected to the driver circuit unit 13; a film sealant 15 covering the organic light emitting element 14; and a water and oxygen barrier layer 16 covering the film sealant 15. In this embodiment of the present application, the water and oxygen barrier layer includes a water and oxygen barrier adhesive 160 covering the film sealant 15 and a water and oxygen barrier film 161 covering the water and oxygen barrier adhesive 160.

In this embodiment of the present application, the supporting film 12 is adhered to the flexible substrate 11 in the following manner.

Figure 3:
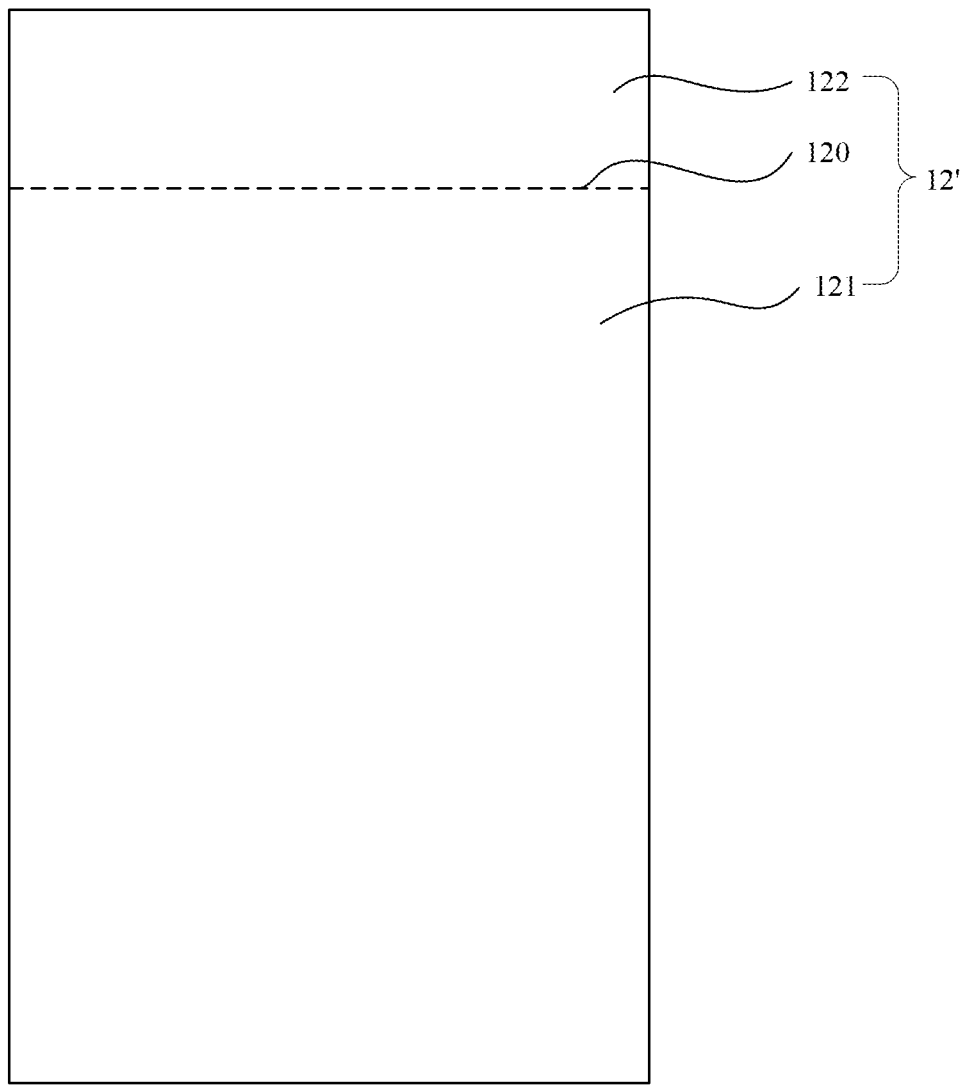
FIG. 3 is a schematic structural diagram of an original supporting film used in Embodiment 1 of the present application.

Firstly, as shown in FIG. 3, an original supporting film 12' having a separator line 120 is provided and the separator line 120 divides the original supporting film 12' into a first portion 121 and a second portion 122. The front of the first portion 121 is viscous and the front of the second portion 122 is non-viscous.

Figure 4:
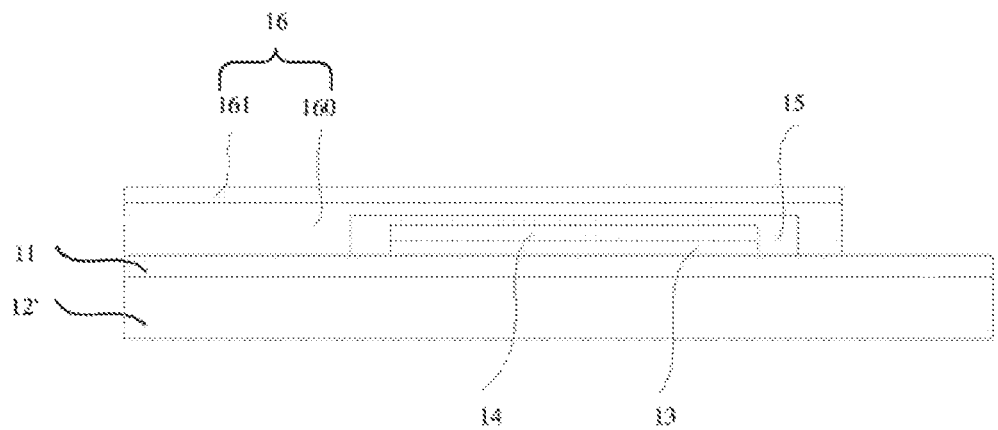
FIG. 4 and FIG. 5 are schematic diagrams of a process of adhering a supporting film to a flexible substrate and bonding a drive chip to the flexible substrate in Embodiment 1 of the present application.

Subsequently, as shown in FIG. 4, the front of the original supporting film 12 is adhered to the back of the flexible substrate 11.

Figure 5:
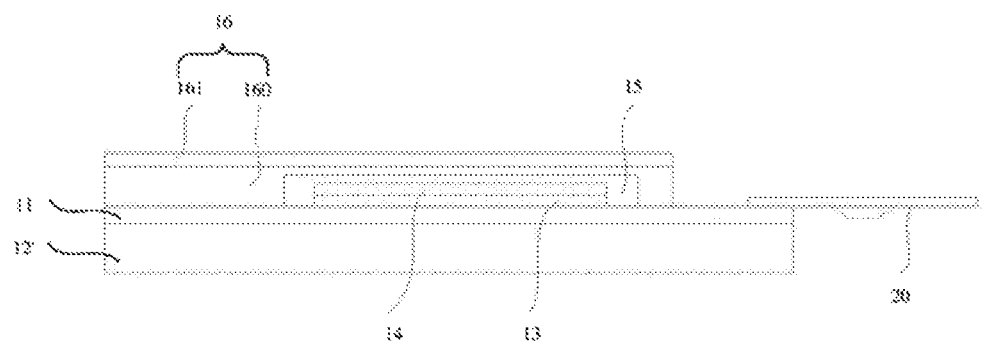

In this embodiment of the present application, after the original supporting film 12' is adhered to the flexible substrate 11, the drive chip 20 is bonded to the bonding region, as shown in FIG. 5.

Finally, the second portion 122 of the original supporting film is removed along the separator line 120. In this case, only the first portion 121 of the original supporting film is adhered to the back of the flexible substrate 11, correspondingly referring to FIG. 1. That is, the supporting film 12 is only adhered to the display region.

In another embodiment of the present application, alternatively, the original supporting film 12' may be adhered to the flexible substrate 11 without having the second portion 122 removed when manufacturing the flexible display. In this embodiment, each of the display region and the bonding region of the obtained flexible display is provided with the supporting film, where the supporting film in the display region (that is, the first portion) is viscous and the supporting film in the bonding region (that is, the second portion) is removable. The supporting film in the bonding region of the flexible display can either be retained or removed in subsequent use, thereby increasing application flexibility.

Embodiment 2

Embodiment 2 differs from Embodiment 1 in that: in Embodiment 1, the bonding region has no supporting film, or the supporting film in the bonding region is removable, and can be selectively retained or removed as needed; however, in Embodiment 2, the supporting film is adhered to each of the display region and the bonding region, wherein the supporting film in the bonding region has holes while the supporting film in the display region has no hole, or the supporting film in each of the bonding region and the display region has holes while the hole ratio of the supporting film in the bonding region is higher than in the display region.

Figure 6:
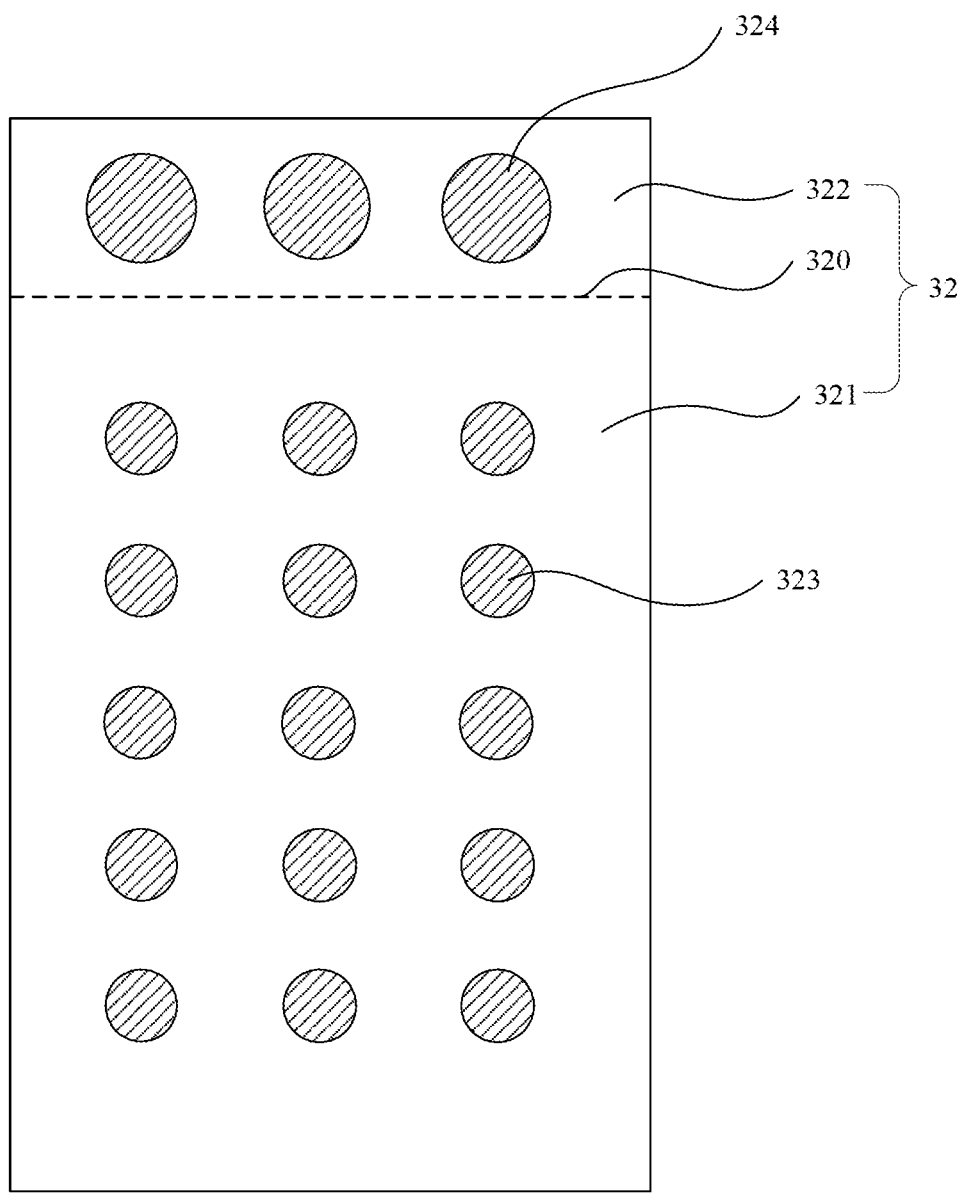
FIG. 6 is a schematic structural diagram of a supporting film used in Embodiment 2 of the present application.

Take the supporting film in each of the bonding region and the display region having holes as example. Specifically, referring to FIG. 6, a schematic structural diagram of the supporting film in Embodiment 2 of the present application.

Figure 2:
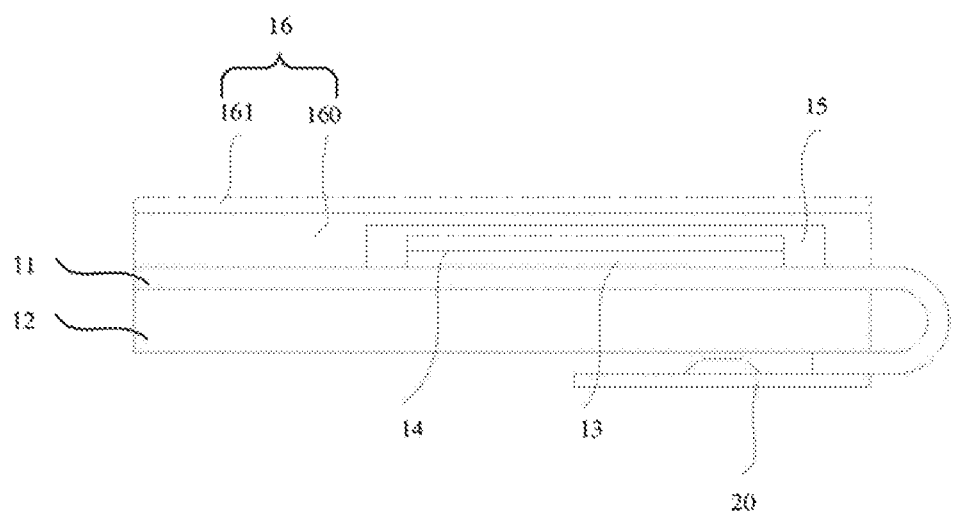
FIG. 2 is a schematic diagram of a partially bended flexible display according to Embodiment 1 of the present application.

As shown in FIG. 2, the supporting film 32 is provided with a separator line 320 dividing the supporting film 32 into a first portion 321 and a second portion 322. The front of the first portion 321 and the second portion 322 are both viscous.

Further, both the first portion 321 and the second portion 322 have holes. Furthermore, there are multiple holes on each of the first portion 321 and the second portion 322, the multiple holes on each of the first portion 321 are regularly spaced apart, the multiple holes on each of the second portion 322 are regularly spaced apart. The hole ratio of the first portion 321 is lower than that of the second portion 322. Herein, hole ratio is the ratio of the hole area to non-hole area. Specifically, the area of pores 324 on the second portion 322 is larger, and the spacing between adjacent pores 324 is smaller. The area of pores 323 on the first portion 321 is smaller, and the spacing between adjacent pores 323 is also small. That is, in this embodiment of the present application, the second portion 322 is more flexible than the first portion 321.

Subsequently, the supporting film 32 is adhered to the back of the flexible substrate, wherein the first portion 321 corresponds to the display region and the second portion 322 corresponds to the bonding region. Next, a drive chip is bonded to the bonding region to obtain a flexible display. In this embodiment of the present application, the supporting film in the bonding region is no longer removed. That is, a supporting film having holes is adhered to the bonding region, and a supporting film having holes is adhered to the display region with the hole ratio of the supporting film adhered to the display region being lower than that of the supporting film adhered to the bonding region. In other words, the supporting film adhered to the display region is less flexible than the supporting film adhered to the bonding region. Hence, on one hand, the flexible display screen is unlikely to be warped when a drive chip is bonded thereto and can be easily sucked by a vacuum cup to facilitate bonding during a flexible display manufacturing process, and on the other hand, the bonding region is able to have excellent bending performance to satisfy a high bending requirement for the bonding region.

The foregoing descriptions are merely descriptions of the preferred embodiments of the present application rather than any limitations to the scope of the present application. Any variations or modifications made by those of ordinary skilled in the art according to the foregoing disclosure fall within the scope of the appended claims.

What is claimed is:

1. A flexible display, comprising: a flexible display screen and a drive chip, wherein the flexible display screen comprises a flexible substrate including a display region and a bonding region, a back of the flexible substrate is adhered with a supporting film and the drive chip is bonded to the bonding region,
    wherein the supporting film is adhered to each of the display region and the bonding region, the supporting film provided in the bonding region has holes formed therein, and the supporting film provided in the display region has no hole.

2. The flexible display according to claim 1, wherein the supporting film provided in the display region is viscous, and the supporting film provided in the bonding region is removable.

3. The flexible display according to claim 1, wherein the supporting film provided in the bonding region is more flexible than the supporting film provided in the display region.

4. The flexible display according to claim 1, wherein a thickness of the supporting film ranges from 0.1 µm to 0.3 µm.

5. The flexible display according to claim 1, wherein the supporting film is made of a material same as a material of the flexible substrate.

6. The flexible display according to claim 1, wherein the supporting film is made of resins.

7. The flexible display according to claim 1, further comprising a driver circuit located on a front of the flexible substrate;
    an organic light emitting element located on the front of the flexible substrate and connected to the driver circuit-unit;
    a film sealant covering the organic light emitting element; and
    a water and oxygen barrier layer covering the film sealant.

8. A flexible display, comprising: a flexible display screen and a drive chip, wherein the flexible display screen comprises a flexible substrate including a display region and a bonding region, a back of the flexible substrate is adhered with a supporting film and the drive chip is bonded to the bonding region,
    wherein the supporting film is adhered to each of the display region and the bonding region, the supporting film in each of the bonding region and the display region has holes formed therein, and a ratio of hole area to non-hole area of the supporting film in the bonding region is larger than a ratio of hole area to non-hole area of the supporting film in the display region.

9. The flexible display according to claim 8, wherein the supporting film provided in the display region is viscous, and the supporting film provided in the bonding region is removable.

10. The flexible display according to claim 8, wherein the supporting film provided in the bonding region is more flexible than the supporting film provided in the display region.

11. The flexible display according to claim 8, wherein a thickness of the supporting film ranges from 0.1 µm to 0.3 µm.

12. The flexible display according to claim 8, wherein the supporting film is made of a material same as a material of the flexible substrate.

13. The flexible display according to claim 8, wherein the supporting film is made of resins.

14. The flexible display according to claim 8, further comprising a driver circuit located on a front of the flexible substrate;
    an organic light emitting element located on the front of the flexible substrate and connected to the driver circuit;
    a film sealant covering the organic light emitting element; and
    a water and oxygen barrier layer covering the film sealant.

* * * * *